US008858666B2

(12) United States Patent
Schier

(10) Patent No.: US 8,858,666 B2
(45) Date of Patent: Oct. 14, 2014

(54) TOOL COATING

(75) Inventor: Veit Schier, Leinfelden-Echterdingen (DE)

(73) Assignee: Walter AG, Tubingen (DE)

( * ) Notice: Subject to any disclaimer, the term of this patent is extended or adjusted under 35 U.S.C. 154(b) by 303 days.

(21) Appl. No.: 13/395,959

(22) PCT Filed: Aug. 26, 2010

(86) PCT No.: PCT/EP2010/062511
§ 371 (c)(1),
(2), (4) Date: Mar. 14, 2012

(87) PCT Pub. No.: WO2011/036022
PCT Pub. Date: Mar. 31, 2011

(65) Prior Publication Data
US 2012/0171509 A1    Jul. 5, 2012

(30) Foreign Application Priority Data
Sep. 23, 2009   (DE) .......................... 10 2009 044 927

(51) Int. Cl.
C23C 14/00   (2006.01)
C23C 14/16   (2006.01)
C23C 28/02   (2006.01)
C23C 30/00   (2006.01)
C23C 14/08   (2006.01)

(52) U.S. Cl.
CPC ............. *C23C 14/081* (2013.01); *C23C 14/165* (2013.01); *C23C 28/02* (2013.01); *C23C 30/005* (2013.01); *C23C 14/0015* (2013.01)
USPC .................... 51/307; 204/192.15; 204/192.16; 51/309; 407/119; 428/216; 428/336; 428/457; 428/469; 428/472; 428/699; 428/701; 428/702; 427/248.1; 427/255.15; 427/255.19; 427/255.28; 427/255.31; 427/331; 427/438; 427/419.1

(58) Field of Classification Search
USPC ............ 51/307, 309; 428/216, 336, 457, 469, 428/472, 697, 699, 701, 702; 204/192.15, 204/0.16; 427/248.1, 255.15, 255.19, 427/255.28, 255.31, 331, 438, 419.1, 427/410.2; 407/119
See application file for complete search history.

(56) References Cited

U.S. PATENT DOCUMENTS 4,904,542 A  *  2/1990  Mroczkowski ............... 428/702
5,698,314 A     12/1997  Goedicke et al.
(Continued)

FOREIGN PATENT DOCUMENTS

DE   195 22 331    1/1996
DE   195 18 779    7/1996
(Continued)

OTHER PUBLICATIONS

German Search Report for Application No. 10 2009 044 927.2 dated Apr. 14, 2010.
(Continued)

*Primary Examiner* — Archene Turner
(74) *Attorney, Agent, or Firm* — Morgan, Lewis & Bockius LLP

(57) ABSTRACT

A coating for a cutting tool, which includes a plurality of mutually superposed layers, characterized in that the coating has an outer cover layer with a first layer portion of metallic aluminium or an aluminium alloy and a second layer portion arranged thereover of aluminium oxide or a mixed oxide which contains aluminium and at least one further metal.

16 Claims, 1 Drawing Sheet

(56) References Cited

U.S. PATENT DOCUMENTS

| | | | |
|---|---|---|---|
| 5,879,823 A * | 3/1999 | Prizzi et al. | 428/697 |
| 6,682,274 B2 | 1/2004 | Votsch et al. | |
| 7,431,747 B2 * | 10/2008 | Heinrich et al. | 51/307 |
| 7,544,024 B2 * | 6/2009 | Omori et al. | 407/119 |
| 7,758,975 B2 | 7/2010 | Schier | |
| 8,025,991 B2 * | 9/2011 | Schier | 428/698 |
| 8,124,222 B2 * | 2/2012 | Myrtveit | 428/216 |
| 2004/0161639 A1 | 8/2004 | Fukano et al. | |
| 2006/0194078 A1 | 8/2006 | Heinrich et al. | |
| 2008/0014421 A1 * | 1/2008 | Inspektor et al. | 428/216 |
| 2008/0102298 A1 | 5/2008 | Kurze et al. | |
| 2008/0193782 A1 * | 8/2008 | Ramm et al. | 428/469 |
| 2009/0181262 A1 * | 7/2009 | Isaksson et al. | 427/409 |

FOREIGN PATENT DOCUMENTS

| | | |
|---|---|---|
| DE | 196 51 592 | 6/1997 |
| DE | 100 48 899 | 4/2002 |
| DE | 103 32 101 | 2/2005 |
| DE | 10 2004 010 285 | 9/2005 |
| EP | 1 762 638 | 3/2007 |
| EP | 1 806 192 A1 | 7/2007 |
| EP | 1 921 177 | 5/2008 |
| JP | 2002-53946 * | 2/2002 |
| WO | 2008/008207 A2 | 1/2008 |

OTHER PUBLICATIONS

Jianming et al., "The corrosion properties of $Al/Al_2O_3$ multilayered coatings on CK45 steel deposited by IBAD," Surface & Coatings Technology 187 (2004), pp. 194-198.

International Search Report for PCT/EP2010/062511, dated Nov. 17, 2010.

Written Opinion of the International Search Report for PCT/EP2010/062511, dated Nov. 17, 2010.

* cited by examiner

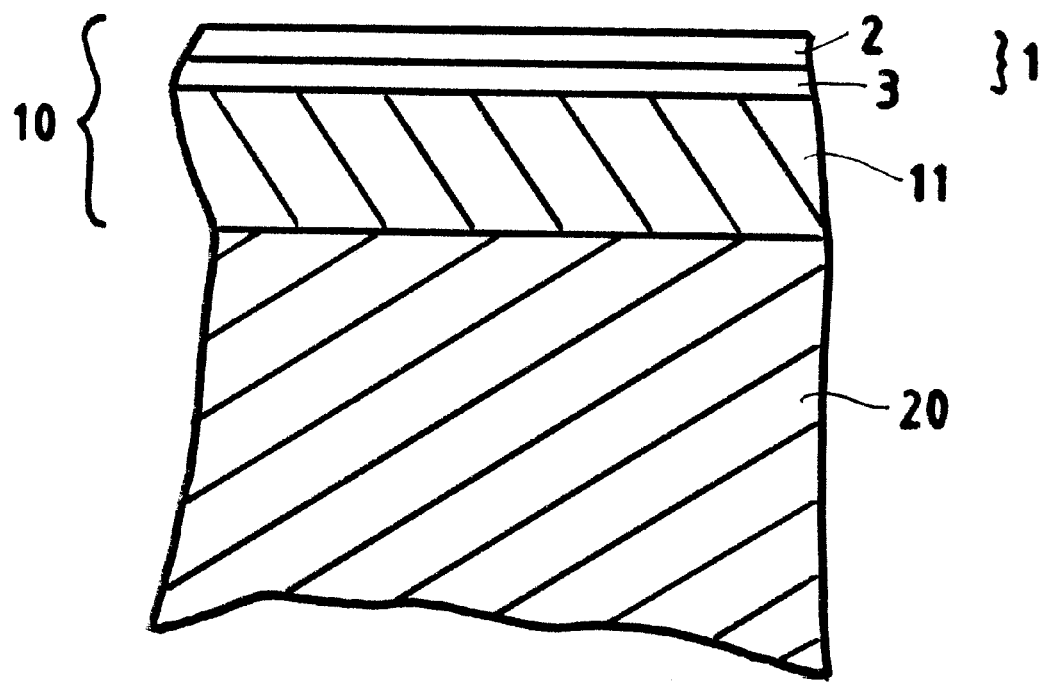

TOOL COATING

RELATED APPLICATIONS

The present application is a U.S. National Phase Application of International Application No. PCT/EP2010/062511 (filed 26 Aug. 2010) which claims priority to German Application No. 10 2009 044 927.2 (filed 23 Sep. 2009).

The present invention concerns a coating for cutting tools, a cutting tool provided with such a coating and a process for the production of cutting tools coated according to the invention.

BACKGROUND OF THE INVENTION

Coated cutting tools which also include in particular interchangeable cutting inserts and cutting bits comprise a substrate or main body with a single-layer or multi-layer coating which is deposited thereon and which serves in particular for wear protection but can also have decorative and indicator functions. The substrate usually comprises steel, carbide metal or cermet and the coating is applied using a CVD process or a PVD process. The coating is also intended to improve the cutting properties of the tool for a given application and/or to reduce tool wear.

Coatings for cutting tools which generally include outer layers with a decorative and/or indicator function are known in the state of the art.

EP 1 762 638 describes a cutting insert comprising a carbide metal substrate and a multi-layer hard material coating for wear protection and an outermost layer of ZrN which is firstly applied in a thickness of <1 μm by means of PVD and is then removed from the rake face and the cutting edge again by brushing or blasting treatment. Abrasive wear of the outer layer is an indicator of whether and how intensively a tool has already been used. DE 10 2004 010 285 and DE 100 48 899 also describe cutting tools with an indicator cover layer of golden brown TiN or also of TiC, HfC or HfN which differ in colour from the subjacent wear protection layer and make it possible to distinguish a tool which has been used from an unused tool, with the naked eye.

The outer hard wear protection layer most frequently used in relation to cutting inserts is a layer of aluminium oxide deposited using a CVD or PVD process. The decorative layer having a decorative and/or indicator function is applied thereover. A disadvantage of the known cover layers of ZrN, TiN, TiC, HfC or HfN is that the application of those layers using the PVD process requires an additional target as a source for the deposited metal component as frequently there is no source for that metal for applying the wear protection coating. In addition it would be advantageous to also have, as the decorative and indicator cover layer, a colour different from the striking golden brown colour of ZrN or TiN in order thereby also to permit colour distinguishability of different types of tool.

OBJECT

Therefore the object of the invention was to provide a coating for a cutting tool having a cover layer with a decorative and/or indicator function, which is comparatively simple and inexpensive to produce.

DESCRIPTION OF THE INVENTION

According to the invention that object is attained by a coating for a cutting tool, which includes a plurality of mutually superposed layers, wherein the coating has an outer cover layer with a first layer portion of metallic aluminium or aluminium alloy and a second layer portion arranged thereover of aluminium oxide or a mixed oxide which contains aluminium and at least one further metal.

With such a coating the grey colour of the aluminium or the aluminium alloy appears through the oxide layer portion which is disposed thereover and which is colourless in itself so that the tool has a satin-finished, light-grey surface. The aluminium oxide or the mixed oxide in that case completely covers over the aluminium and protects it from external influences, in particular from oxidation and other reactions for example due to moisture or perspiration from the hand, and thereby prevents a change in the metallic layer.

In accordance with the present invention a metallic layer portion of aluminium or an aluminium alloy is such a layer portion comprising the pure metal or the pure metal alloy, in which respect usual impurities are not excluded. If the metal layer portion contains an oxygen proportion of up to 10 At.-% and it does not lose its metallic character thereby, that is intended to be embraced in accordance with this invention by the expression metallic layer portion.

As many coatings which provide protection from wear have layer portions of aluminium oxide and/or a mixed oxide containing aluminium and at least one further metal a suitable aluminium target or a mixed target with aluminium and a further metal or an aluminium target and a further metal target is generally already present in a PVD apparatus for applying such coatings so that a cover layer according to the invention can be easily applied over the wear layer without a change in the target or targets in the PVD apparatus being required.

A further advantage of the cover layer according to the invention in the coating is that it can be readily removed by mechanical abrasion processes, for example blasting treatment with a particulate blasting agent or by brushing.

In a preferred embodiment of the invention in the cover layer the first layer portion of aluminium or an aluminium alloy is of a layer thickness of 10 nm to 500 nm, preferably 20 nm to 70 nm. The second layer portion of aluminium oxide or a mixed oxide which contains aluminium and at least one further metal is preferably of a layer thickness of 5 nm to 100 nm, particularly preferably 10 nm to 50 nm. For example the cover layer preferably comprises a 50 nm thick first layer portion of metallic aluminium, followed by a 20 nm thick second layer portion of aluminium oxide.

Further preferably the coating under the cover layer has at least one metallic hard material layer as a wear protection layer, preferably a hard material layer of aluminium oxide. A triple-layer coating which contains only aluminium as the metal component can be inexpensively produced using a single target for all layer portions of the coating employing the PVD process. In further embodiments of the invention the coating includes further hard material layer portions as wear protection layers. Preferred hard material layer portions are for example layer portions of TiAlN, AlCrN or mixtures thereof, and also those which contain Si. In a preferred embodiment the hard material layer portions provided as wear protection layers are of a layer thickness of 0.5 to 10 μm, preferably 1.0 to 5 μm, in particular preferably about 3 μm. Then for example an aluminium oxide layer can be arranged thereover, of a layer thickness of for example 1 μm, followed by the cover layer according to the invention with a first layer portion of metallic aluminium or an aluminium alloy and a second layer portion arranged thereover of aluminium or a mixed oxide which contains aluminium and at least one further metal.

Quite particularly preferably in the coating according to the invention the first layer portion of the outer cover layer comprises metallic aluminium and/or the second layer portion arranged thereover comprises aluminium oxide. That layer succession can be advantageously produced with only one aluminium target using the PVD process.

In an alternative embodiment in the coating according to the invention the first layer portion of the outer cover layer comprises aluminium-chromium alloy and/or the second layer portion arranged thereover comprises aluminium-chromium oxide $(AlCr)_2O_3$. Further alloys and mixed oxides with aluminium with other metals can be easily produced by the man skilled in the art and are to be embraced by the scope of the invention.

In an embodiment of the invention in the coating the outer cover layer has at least twice and preferably a plurality of times in mutually superposed relationship a layer portion succession comprising a first layer portion of metallic aluminium or an aluminium alloy and a second layer portion arranged thereover of aluminium oxide or a mixed oxide which contains aluminium and at least one further metal. In that embodiment the cover layer thus contains a multiple succession of metallic layer portions and oxide layer portions.

In a further embodiment of the invention in the coating the outer cover layer over the outermost oxide layer portion of aluminium oxide or a mixed oxide has a further layer portion of metallic aluminium or an aluminium alloy. Such an outer metallic layer portion serves predominantly as a decorative or wear indicator layer portion as it is not abrasion-resistant. In use of the cutting tool it will be rapidly abraded away upon contact with the workpiece.

The invention also embraces a cutting tool which comprises a substrate or main body with a single-layer or multi-layer coating according to the invention deposited thereon. The substrate or main body preferably comprises carbide metal, cermet, ceramic or steel.

In an embodiment of the cutting tool according to the invention the outer cover layer is present only on selected regions of the tool in/on the coating. Such an arrangement of the cover layer can be produced by the cover layer being applied only to selected regions of the tool, which however is difficult using the usual PVD deposition process. Preferably the outer cover layer is applied completely and removed from the coating again after application in selected regions of the tool.

Cutting tools such as cutting bits for metal working have adjoining a cutting edge a rake face and a relief face. In particularly preferred embodiments of the cutting tools according to the invention of the aforementioned kind the coating is at least partially and preferably completely free of the outer cover layer on the rake face and/or the cutting edge. In that way portions of the cutting tool, which are particularly mechanically stressed and come into contact with the workpiece, are free from the cover layer with the decorative and/or indicator function. The cover layer would be very rapidly abraded away with a corresponding mechanical loading. In addition the cover layer on the rake face and possibly also on the cutting edge can have unwanted frictional and lubrication effects. In contrast thereto portions of the cutting tool, which are exposed to a low level of or no mechanical loading, are protected from corrosion by the cover layer. In addition on those portions the cover layer has a decorative and/or indicator function and indicates use of the cutting tool as the cover layer, even with a low loading, already exhibits abrasion traces such as for example in regions of the relief face in the proximity of the cutting edge.

The invention also concerns a process for the production of the coated cutting tool described herein, wherein a multi-layer coating of the kind described herein is applied by CVD and/or PVD processes to a substrate or main body, wherein the outer cover layer with the first layer portion of metallic aluminium or an aluminium alloy and the second layer portion arranged thereover of aluminium oxide or a mixed oxide which contains aluminium and at least one further metal is applied in the PVD process with at least one aluminium-containing target.

Substantially all known PVD processes can be used for applying the cover layer such as for example dual magnetron sputtering, reactive magnetron sputtering, arc vapour deposition (ARC), pulsed arc vapour deposition (ARC) or HIPIMS (high power impulse magnetron sputtering).

The PVD process is desirably implemented in an inert gas atmosphere, preferably argon, wherein oxygen is added as the reactive gas for the deposition of aluminium oxide.

In a further preferred embodiment of the invention in a subsequent process step the outer cover layer with the first layer portion of metallic aluminium or an aluminium alloy and the second layer portion arranged thereover of aluminium oxide or a mixed oxide which contains aluminium and at least one further metal is removed from selected surface regions of the cutting tool again by a mechanical abrasion process. In particular in that process step the outer cover layer is removed from the rake faces and/or the cutting edges of a cutting tool.

Preferably the mechanical abrasion process is brushing or an abrasive blasting process with a particulate blasting agent, for example quartz sand or corundum.

Further advantages, features and possible uses of the present invention will be clearly apparent from the description hereinafter of a FIGURE and preferred embodiments.

FIG. 1

FIG. 1 shows a diagrammatic broken-away sectional view of a cutting tool with a coating according to the invention. The view is greatly enlarged and is not true to scale.

A coating 10 is applied to a substrate or main body 20. In this embodiment the coating 10 includes a wear protection layer 11 which can comprise one or more layer portions. In particular the wear protection layer can comprise a plurality of layer portions of different materials which for example are applied alternately.

Disposed on the wear protection layer 11 is a cover layer 1 comprising a first layer portion 3 of metallic aluminium and a second layer portion 2 of aluminium oxide, which is arranged over the first layer portion, from the substrate. The first layer portion 3 of metallic aluminium adheres to the wear protection layer 11 but can be well removed. The second layer portion 2 of aluminium oxide adheres well to the first layer portion of metallic aluminium and protects it from corrosion.

Embodiment

Using a PVD coating installation (Flexicoat; Hauzer Techno Coating) carbide metal substrates having a wear protection coating with an outermost layer portion of $Al_2O_3$ are provided with a double-layer cover layer. Prior to deposition of the layer portions the installation was evacuated to $1 \times 10^{-5}$ mbar.

Deposition of the cover layer comprising two layer portions was effected under the following conditions:

1st Layer Portion: (Metallic Aluminium; Al)
  PVD process: non-reactive magnetron sputtering
  Target: rectangular Al source (80 cm×20 cm)
  Deposition: specific cathode power about 7 $W/cm^2$ 0.5 Pa Ar-pressure 30 volts substrate bias voltage, bipolarly pulsed at 70 kHz
  Temperature: 550° C.
  Layer thickness: 50 nm 2nd Layer Portion: (Aluminium Oxide; $Al_2O_3$)
PVD process: reactive magnetron sputtering
Target: rectangular Al source (80 cm×20 cm)
Deposition: specific cathode power about 7 W/cm² 0.5 Pa Ar-pressure, about 80 sccm $O_2$ (as reactive gas) 150 volts substrate bias voltage, bipolarly pulsed at 70 kHz
Temperature: 550° C.
Layer thickness: 20 nm The coated cutting tools have a matt-grey surface which was easy to remove by sand blasting.

For the purposes of the original disclosure it is pointed out that all features as can be seen by a man skilled in the art from the present description and the accompanying claims, even if they are described in specific terms only in connection with certain other features, can be combined both individually and also in any combinations with others of the features or groups of features disclosed here insofar as that has not been expressly excluded or technical aspects make such combinations impossible or meaningless. A comprehensive explicit representation of all conceivable combinations of features is dispensed with here only for the sake of brevity and readability of the description.

The invention claimed is:

1. A coating for a cutting tool, which includes a plurality of mutually superposed layer portions,
   wherein the coating has an outer cover layer with a first layer portion of metallic aluminium or an aluminium alloy of a layer of thickness 10 nm to 500 nm,
   wherein a second layer portion arranged thereover of aluminium oxide or a mixed oxide which contains aluminium and at least one further metal of a layer of thickness 5 nm to 100 nm,
   wherein the coating under the cover layer has at least one metallic hard material layer portion as a wear protection layer, and
   wherein the outer cover layer with the first layer portion of metallic aluminium or an aluminium alloy and the second layer arranged thereover of aluminium oxide or a mixed oxide which contains aluminium and at least one further metal is produced in the PVD process with at least one aluminium-containing target.

2. A coating according to claim 1 wherein the first layer portion of aluminium or an aluminium alloy is of a layer thickness of 20 nm to 70 nm, and the second layer portion of aluminium oxide or a mixed oxide which contains aluminium and at least one further metal is of a layer thickness of 10 nm to 50 nm.

3. A coating according to claim 1 wherein the coating under the cover layer has at least one metallic hard material layer portion of aluminium oxide as a wear protection layer.

4. A coating according to claim 1, wherein the first layer portion of the outer cover layer comprises metallic aluminium and/or the second layer portion arranged thereover comprises aluminium oxide.

5. A coating according claim 1 wherein the first layer portion of the outer cover layer comprises aluminium-chromium alloy and/or the second layer portion arranged thereover comprises aluminium-chromium oxide $(AlCr)_2O_3$.

6. A coating according to claim 1, wherein the outer cover layer has at least twice and preferably a plurality of times in mutually superposed relationship a layer portion succession comprising a first layer portion of metallic aluminium or an aluminium alloy and a second layer portion arranged thereover of aluminium oxide or a mixed oxide which contains aluminium and at least one further metal.

7. A coating according to claim 1, wherein the outer cover layer over the outermost oxide layer portion of aluminium oxide or a mixed oxide has a further layer portion of metallic aluminium or an aluminium alloy.

8. A cutting tool comprising a substrate or main body with a single-layer or multi-layer coating deposited thereon according to claim 1.

9. A cutting tool according to claim 8 wherein the outer cover layer is present only on selected regions of the tool in/on the coating and/or the outer cover layer was removed from the coating again after the application of selected regions of the tool.

10. A cutting tool according to claim 8 wherein the coating is at least partially or completely free of outer cover layer on the rake face and/or the cutting edge.

11. A process for the production of a coated cutting tool in which a multi-layer coating according to claim 1 is applied by CVD and/or PVD processes to a substrate or main body, wherein the outer cover layer with the first layer portion of metallic aluminium or an aluminium alloy and the second layer portion arranged thereover of aluminium oxide or a mixed oxide which contains aluminium and at least one further metal is applied in the PVD process with at least one aluminium-containing target.

12. A process according to claim 11 wherein in a subsequent process step the outer cover layer with the first layer portion of metallic aluminium or an aluminium alloy and the second layer portion arranged thereover of aluminium oxide or a mixed oxide which contains aluminium and at least one further metal is removed from selected surface regions of the cutting tool again by a mechanical abrasion process.

13. A process according to claim 12 wherein the mechanical abrasion process is brushing or an abrasive blasting process with a particulate blasting agent.

14. A cutting tool according to claim 8, wherein the substrate or main body is of carbide metal, cermet, ceramic or steel.

15. A coating according to claim 1, wherein first layer portion of metallic aluminium or an aluminium alloy is a coloring coating layer and has a satin-finished, light-gray surface.

16. A coating according to claim 1, wherein the second layer portion of aluminium oxide or a mixed oxide covers the first layer portion and protects the first layer portion from oxidation.

* * * * *